(12) United States Patent
Chuang et al.

(10) Patent No.: US 10,068,773 B2
(45) Date of Patent: Sep. 4, 2018

(54) CONTACT FORMATION FOR SPLIT GATE FLASH MEMORY

(71) Applicant: Taiwan Semiconductor Manufacturing Company, Ltd., Hsin-Chu (TW)

(72) Inventors: Harry-Hak-Lay Chuang, Singapore (SG); Wei-Cheng Wu, Zhubei (TW); Ya-Chen Kao, Fuxing Township (TW); Chin-Yi Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 15/169,270

(22) Filed: May 31, 2016

(65) Prior Publication Data

US 2016/0276159 A1 Sep. 22, 2016

Related U.S. Application Data

(62) Division of application No. 13/968,772, filed on Aug. 16, 2013, now Pat. No. 9,390,927.

(51) Int. Cl.
*H01L 21/28* (2006.01)
*H01L 29/792* (2006.01)
(Continued)

(52) U.S. Cl.
CPC .. *H01L 21/28518* (2013.01); *H01L 21/28008* (2013.01); *H01L 21/28088* (2013.01); *H01L 21/28273* (2013.01); *H01L 21/28282* (2013.01); *H01L 21/76805* (2013.01); *H01L 21/76895* (2013.01); *H01L 21/823842* (2013.01); *H01L 27/11521* (2013.01); *H01L 27/11546* (2013.01); *H01L 27/11568* (2013.01); *H01L 27/11573* (2013.01); *H01L 29/42328* (2013.01); *H01L 29/42344* (2013.01); *H01L 29/4966* (2013.01); *H01L 29/66545* (2013.01); *H01L 29/7881* (2013.01); *H01L 29/792* (2013.01)

(58) Field of Classification Search
CPC ....... H01L 27/112–27/11597; H01L 29/42344; G11C 11/34–11/419; G11C 16/00–16/3495
See application file for complete search history.

(56) References Cited

U.S. PATENT DOCUMENTS 6,413,821 B1 7/2002 Ebina et al.
6,787,415 B1 9/2004 Chung et al.
(Continued)

FOREIGN PATENT DOCUMENTS

CN 1945836 A 4/2007
CN 101807548 A 8/2010

*Primary Examiner* — Eric Ward
(74) *Attorney, Agent, or Firm* — Slater Matsil, LLP

(57) ABSTRACT

An integrated circuit structure includes a plurality of flash memory cells forming a memory array, wherein each of the plurality of flash memory cells includes a select gate and a memory gate. A select gate electrode includes a first portion including polysilicon, wherein the first portion forms select gates of a column of the memory array, and a second portion electrically connected to the first portion, wherein the second portion includes a metal. A memory gate electrode has a portion forming memory gates of the column of the memory array.

20 Claims, 21 Drawing Sheets

(51) Int. Cl.
*H01L 21/285* (2006.01)
*H01L 29/423* (2006.01)
*H01L 27/11521* (2017.01)
*H01L 27/11546* (2017.01)
*H01L 27/11568* (2017.01)
*H01L 27/11573* (2017.01)
*H01L 29/788* (2006.01)
*H01L 21/8238* (2006.01)
*H01L 29/49* (2006.01)
*H01L 29/66* (2006.01)
*H01L 21/768* (2006.01)

(56) References Cited

U.S. PATENT DOCUMENTS

| | | |
|---|---|---|
| 6,809,385 B2 | 10/2004 | Ebina et al. |
| 7,061,043 B2 | 6/2006 | Owa |
| 7,247,907 B2 | 7/2007 | Gao et al. |
| 7,816,947 B1 | 10/2010 | Wang |
| 8,815,675 B2 | 8/2014 | Sugiyama et al. |
| 8,956,941 B2 * | 2/2015 | Tsukuda ............ H01L 29/66833 438/287 |
| 2006/0035435 A1 | 2/2006 | Yasui et al. |
| 2010/0006914 A1 | 1/2010 | Nakagawa |
| 2010/0078705 A1 | 4/2010 | Chakihara et al. |
| 2010/0301404 A1 | 12/2010 | Kawashima |
| 2011/0095348 A1 | 4/2011 | Chakihara et al. |
| 2011/0272753 A1 | 11/2011 | Funayama et al. |
| 2012/0139025 A1 | 6/2012 | Gely et al. |
| 2012/0299084 A1 | 11/2012 | Saito et al. |
| 2013/0214346 A1 * | 8/2013 | Hall ................. H01L 29/66833 257/325 |
| 2014/0227843 A1 * | 8/2014 | Tsukamoto ....... H01L 21/28282 438/275 |

* cited by examiner

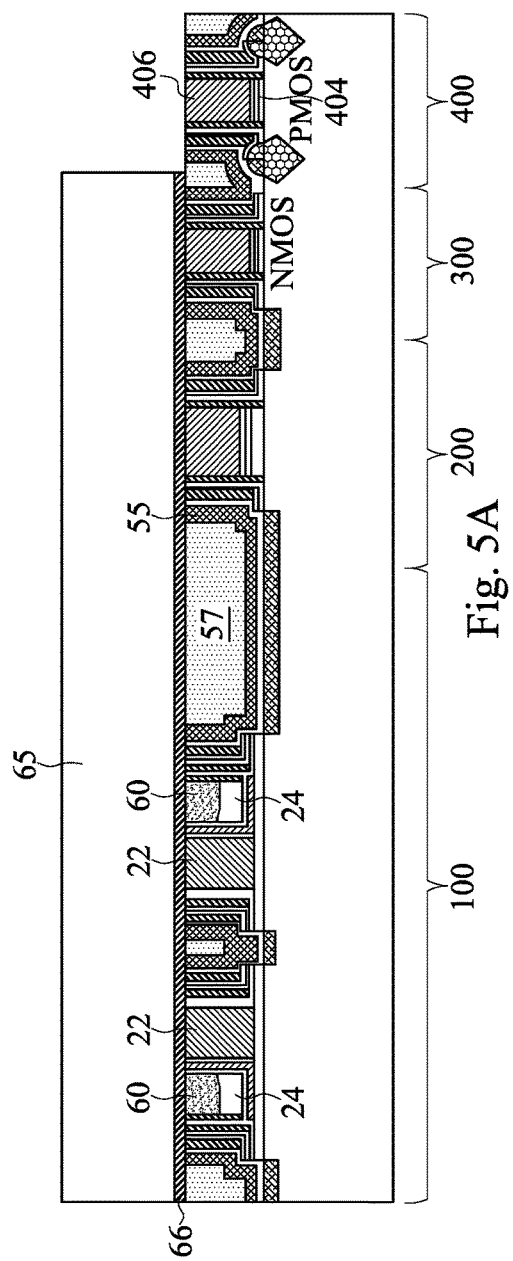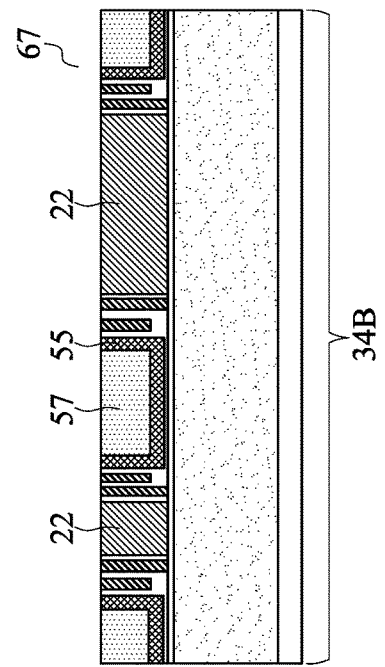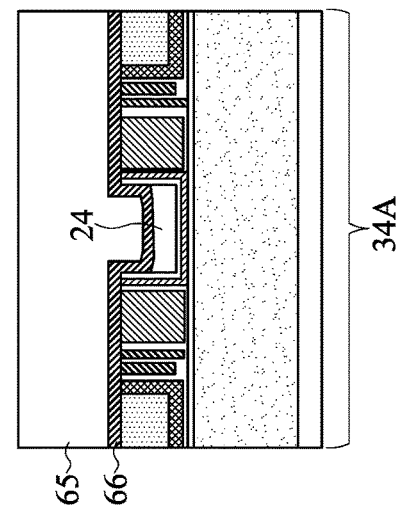

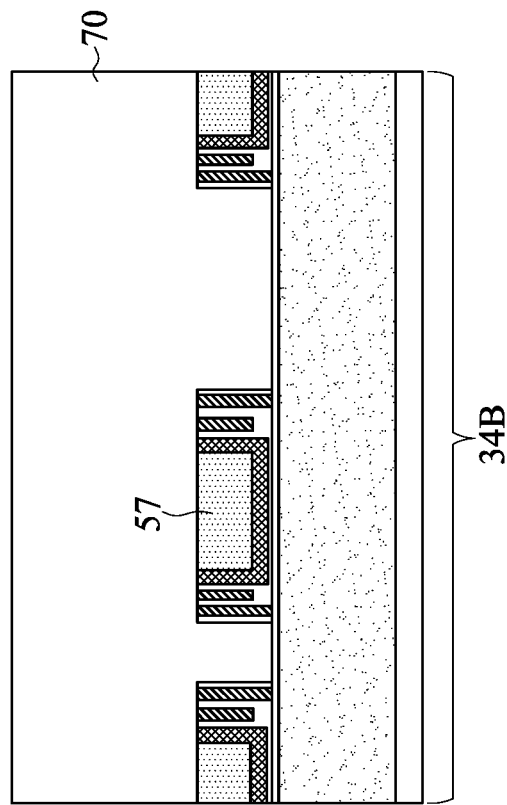
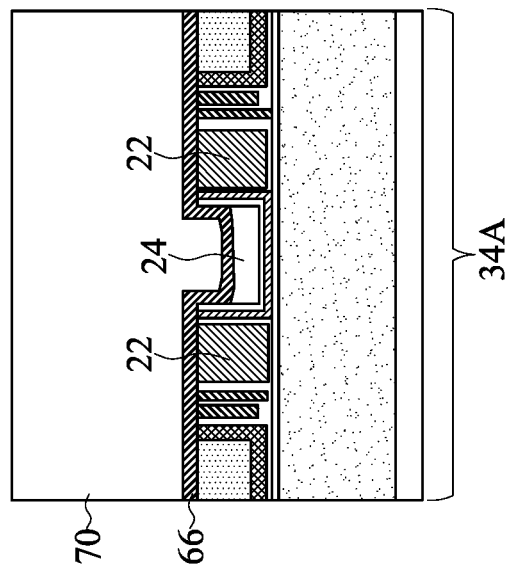
Fig. 9B
Fig. 9C

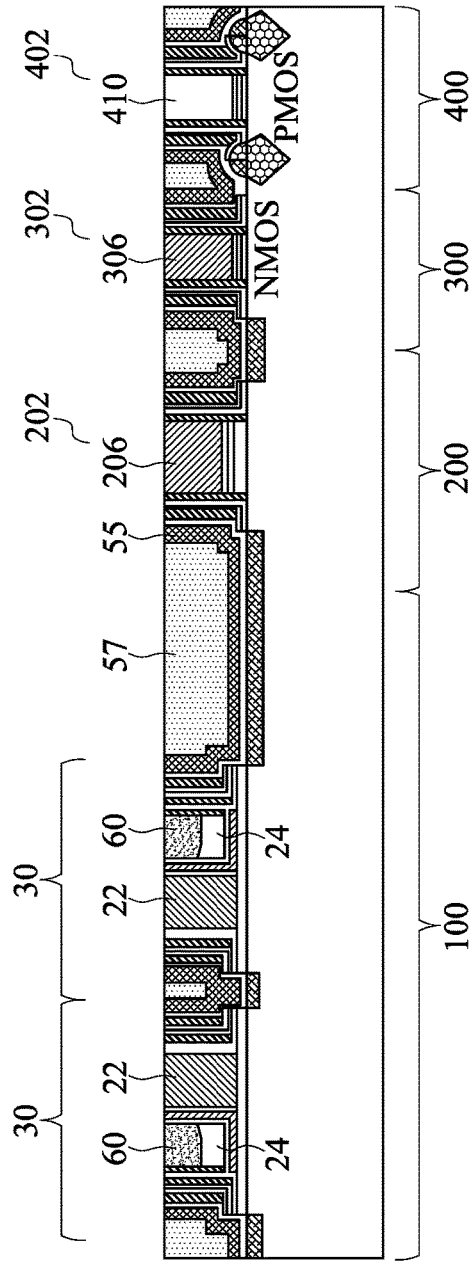
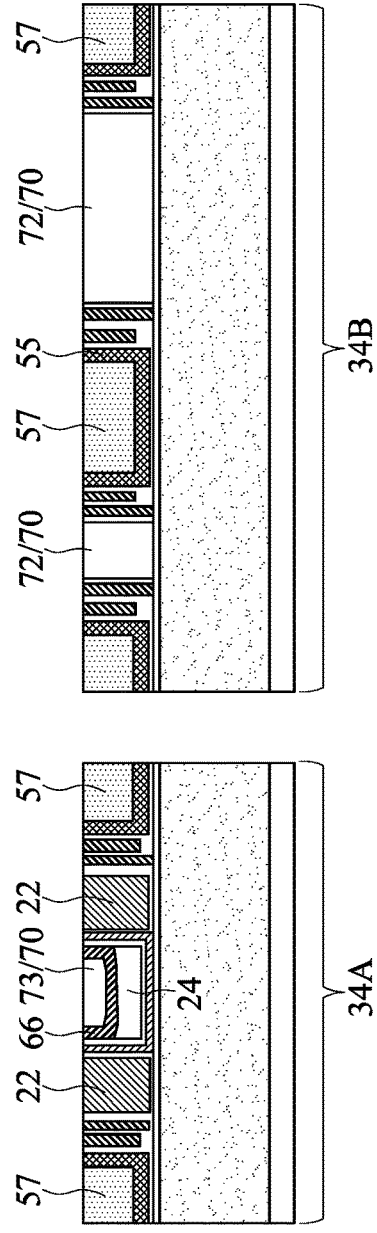
Fig. 10A
Fig. 10B
Fig. 10C

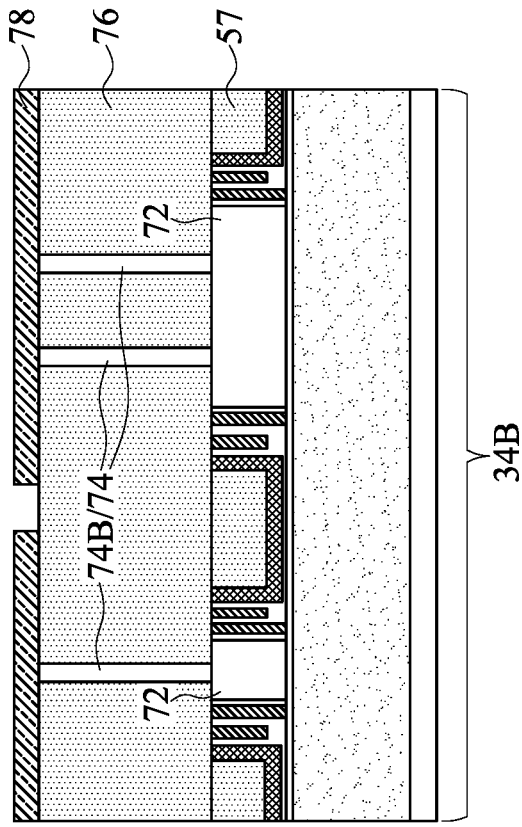
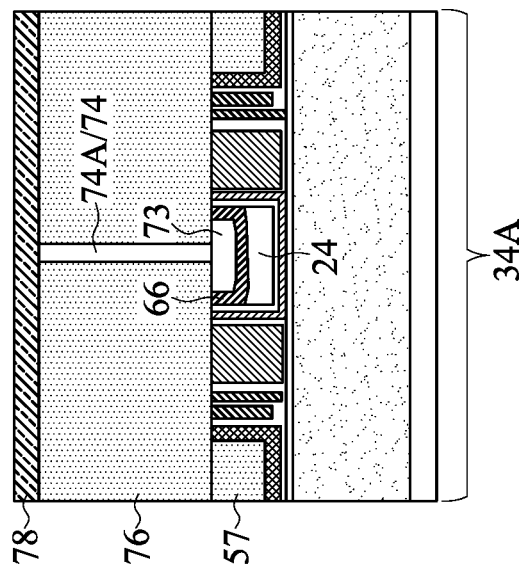
Fig. 11B
Fig. 11C

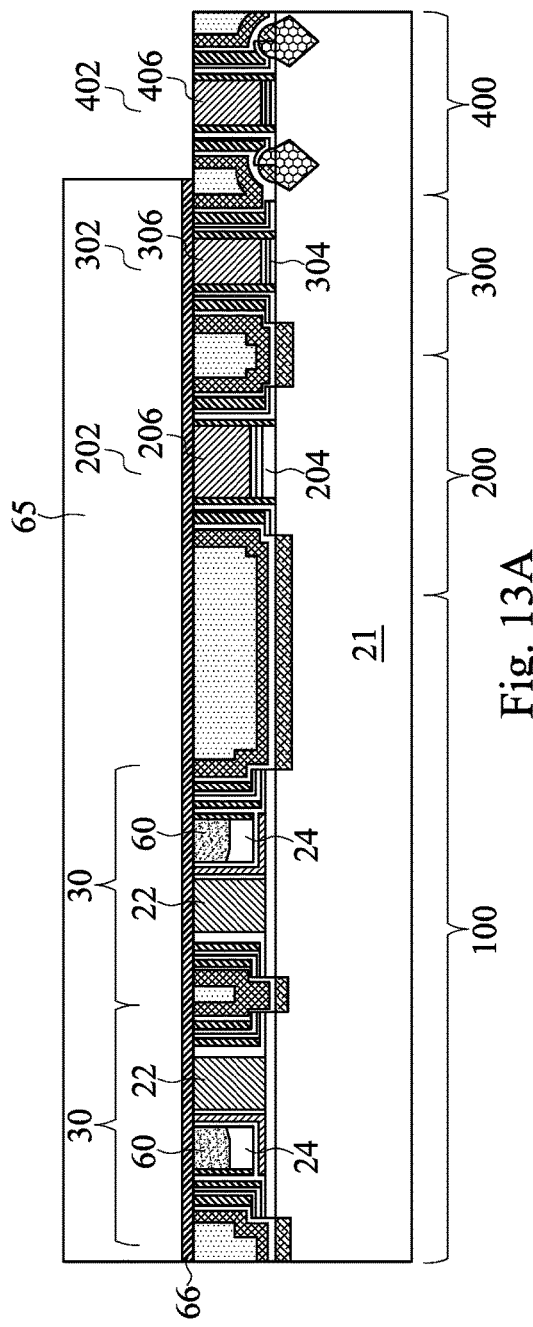
Fig. 13A
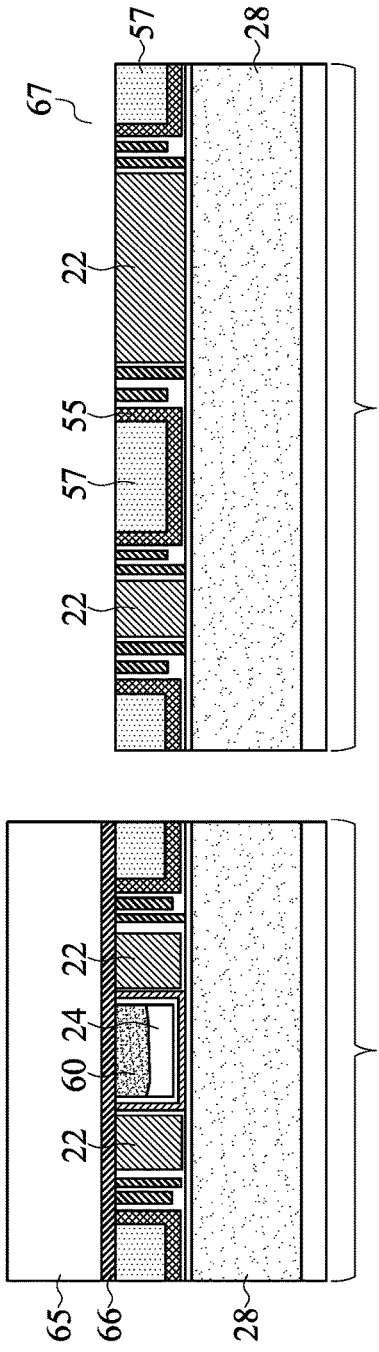
Fig. 13B
Fig. 13C

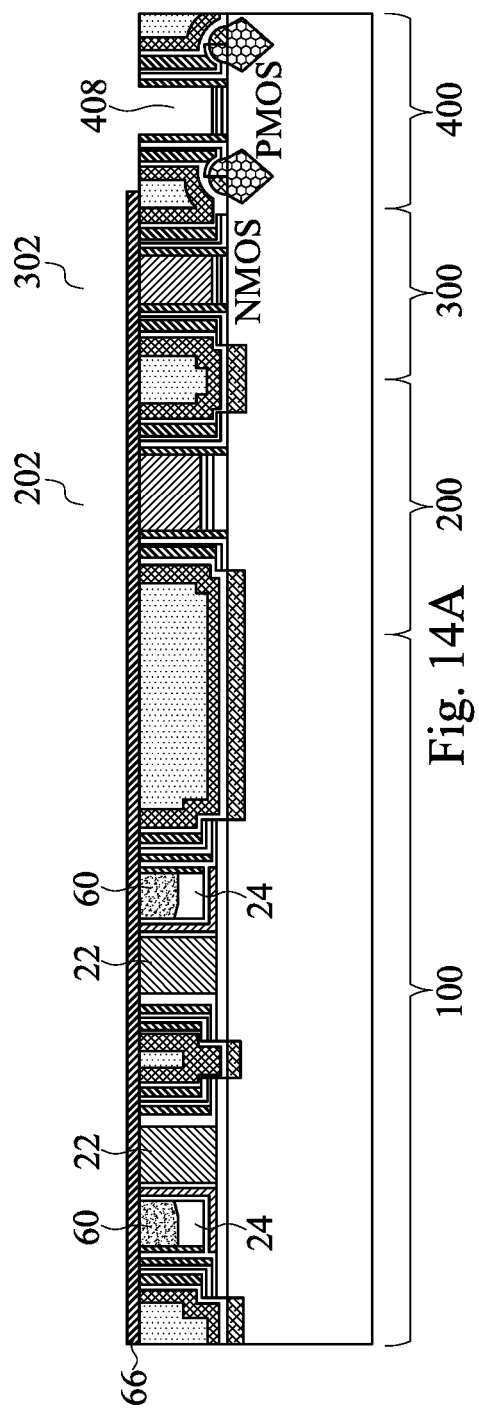
Fig. 14A
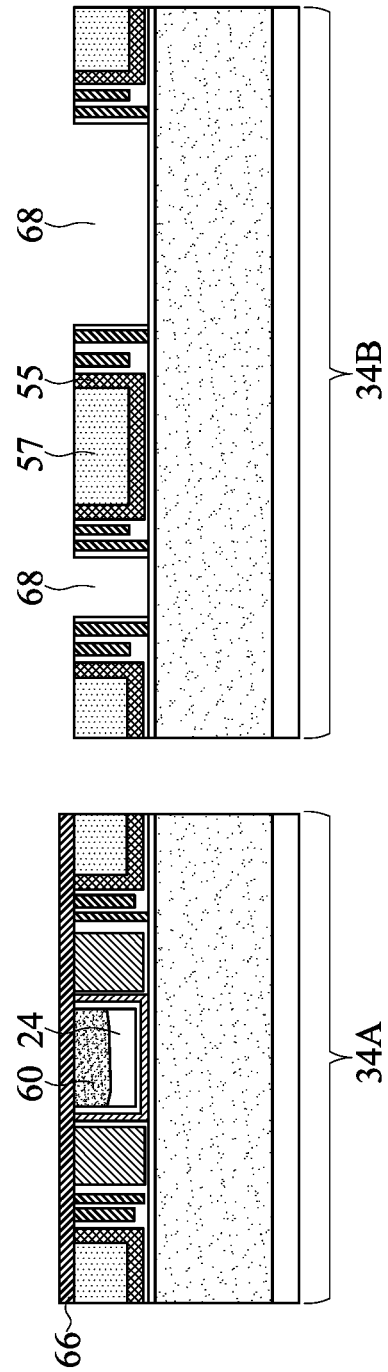
Fig. 14B
Fig. 14C

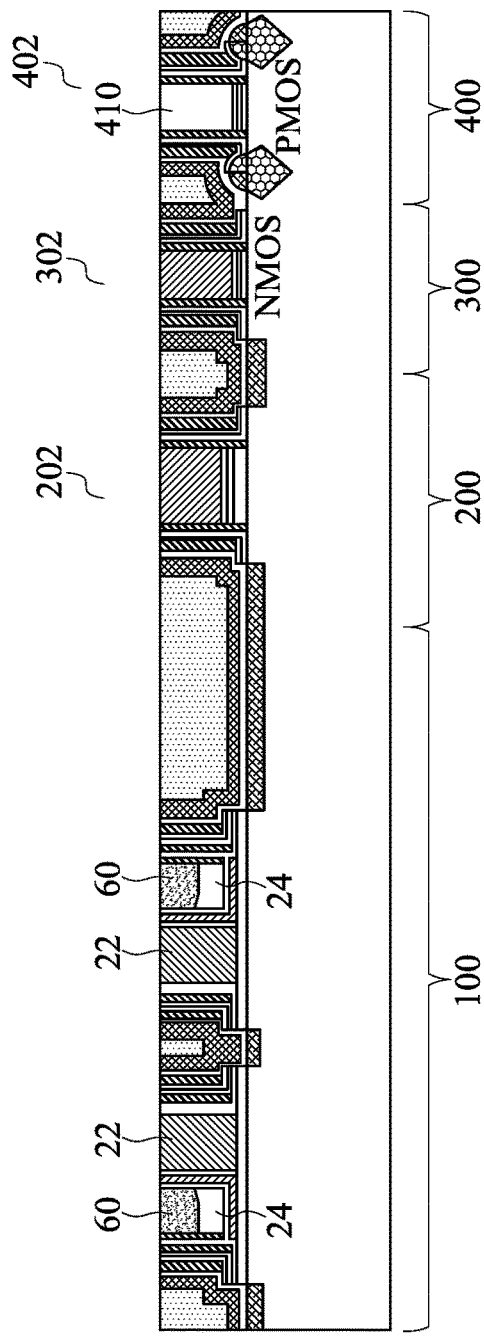
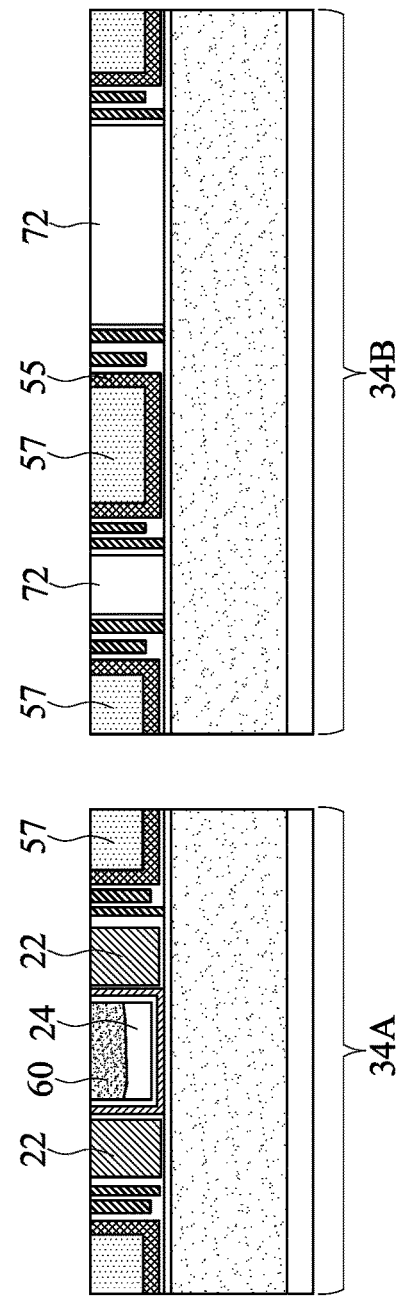
Fig. 16A
Fig. 16B
Fig. 16C

US 10,068,773 B2

CONTACT FORMATION FOR SPLIT GATE FLASH MEMORY

This patent application is a divisional of U.S. patent application Ser. No. 13/968,772, filed on Aug. 16, 2013, titled "Contact Formation for Split Gate Flash Memory," which is incorporated by reference herein as if reproduced in its entirety.

BACKGROUND

Flash memories are commonly used in integrated circuits. There are many designs for the flash memories. In one of the designs, a flash memory includes a gate dielectric over an active region, a select gate over the gate dielectric, and a charge storage layer on a side of the select gate and separated from the active region by an insulating film. A memory gate is on an opposite side of the storage layer than the select gate. A source region and a drain region are formed in the active region, with the select gate, the charge storage layer, and the select gate between the source and drain regions.

The memory gate and the select gate are formed of polysilicon. The select gate and the memory gate have different structures, with the memory gate covered by an insulating film, and the select gate not covered by the dielectric layer. Accordingly, to form contact plugs to connect to the memory gate and the select gate, two separate photolithography processes are needed. The cost of manufacturing the integrated circuit is thus increased. In addition, since the contact plugs are landed on the polysilicon of the memory gate and the select gate, with no silicide therebetween, the contact resistance is high.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 12 are cross-sectional views and top views of intermediate stages in the manufacturing of electrical connections connecting to an embedded split gate flash memory in accordance with some exemplary embodiments; and FIGS. 13A through 17C are cross-sectional views of intermediate stages in the manufacturing of electrical connections connecting to an embedded split gate flash memory in accordance with alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An electrical connection to an embedded split gate flash memory and the method of forming the same are provided in accordance with various exemplary embodiments. The intermediate stages of forming the electrical connections to the embedded split gate flash memory are illustrated. The variations of the embodiments are discussed. Throughout the various views and illustrative embodiments, like reference numbers are used to designate like elements.

Figure 1:
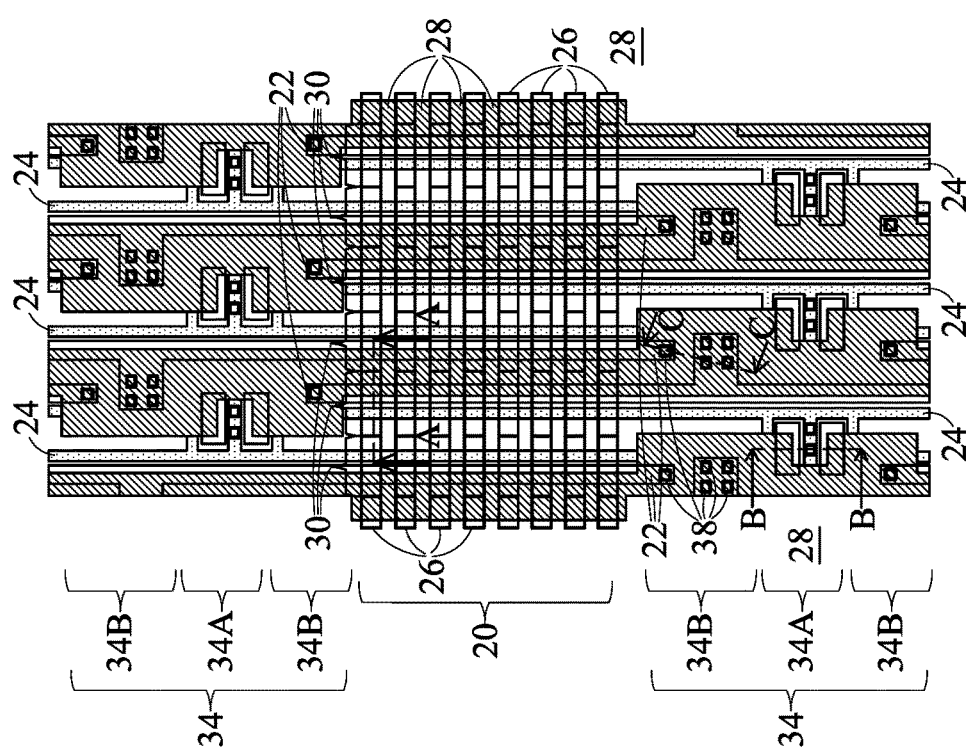

FIGS. 1 through 12 illustrate the cross-sectional views and top views of intermediate stages in the formation of the electrical connections to the embedded split gate flash memory in accordance with some embodiments. FIG. 1 illustrates a top view of a portion of flash memory array 20 and the respective contact pad regions 34. Contact pad regions 34 are used for forming contact plugs to electrically connect to select gates 22 and memory gates 24 of memory array 20. As shown in FIG. 1, flash memory array 20 includes a plurality of rows of active regions 26 extending in a row direction. Active regions 26 may be parts of a semiconductor substrate isolated from each other by isolation regions 28, which may be Shallow Trench Isolation (STI) regions in some embodiments. A plurality of select gates 22 and a plurality of memory gates 24 extend in the column direction. Each of active regions 26 forms a split gate flash memory cell 20 with one select gate 22 and one memory gate 24. Accordingly, a plurality of split gate flash memory cells 20 forms the memory array including a plurality of rows and columns.

Select gates 22 and memory gates 24 are formed as long strips having lengthwise directions extending in the column direction of memory array 20. The contact plugs for connecting to select gates 22 and memory gates 24 are formed in contact pad regions 34 (including regions 34A and 34B), which are on the opposite ends of memory array 20. The rectangles 38 are illustrated to show the positions for forming contact plugs, although the contact plugs have not been formed at this step.

Figure 2A:
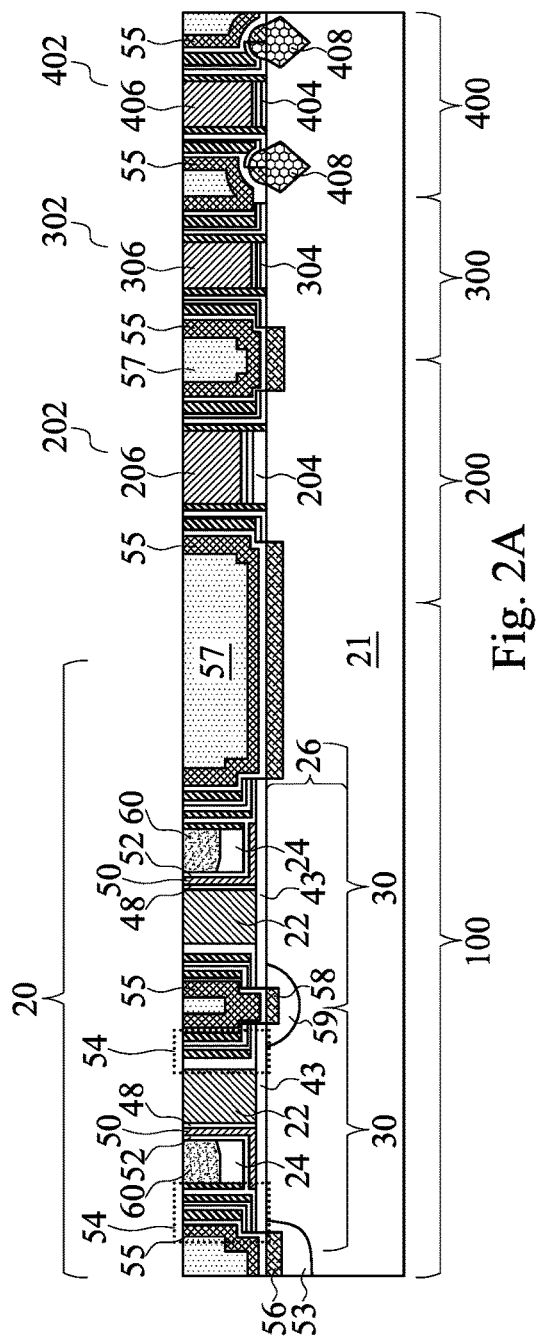
Figure 2B:
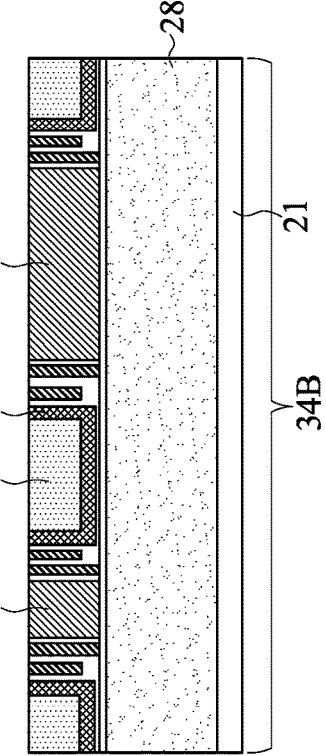
Figure 2C:
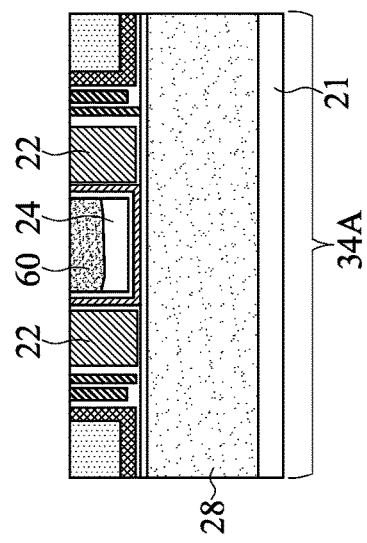

FIGS. 2A, 2B, and 2C illustrate cross-sectional views of the structure in FIG. 1. FIG. 2A includes a portion of memory array 20 formed in device region 100, wherein the cross-sectional view of device region 100 may be obtained from the plane containing line A-A in FIG. 1. FIG. 2A also includes device regions 200, 300, and 400. Device region 200 is a High-Voltage (HV) device region. Device regions 300 and 400 are selected from an Input/output (IO) region, a Static Random Access Memory (SRAM) region, and a general logic (core) device region. Device region 100 is used for forming embedded flash memory cells 30 therein. HV region 200 is used for forming HV Metal-Oxide-Semiconductor (MOS) device 202 therein. NMOS Region 300 is used for forming NMOS device 302 therein, wherein NMOS device 302 may be an IO device, a core device, or an SRAM MOS device. PMOS region 400 is used for forming PMOS device 402 therein, wherein PMOS device 402 may also be an IO device, a core device, or an SRAM MOS device. HV device 202 is supplied with, and is configured to endure, a positive power supply voltage higher than the positive power supply voltage of devices 302 and 402. For example, devices 302 and 402 may be supplied with a positive power supply voltage lower than about 1V, and device 202 may be supplied with a positive power supply voltage between about 1.5V and about 15V.

As shown in FIG. 2A, each of split gate flash memory devices 30 includes gate dielectric 43 on active region 26, and select gate 22 over gate dielectric 43. Active region 26 may be a part of semiconductor substrate 21. Memory gate 24 is on the source side of select gate 22, and is spaced apart from select gate 22 by charge storage layer 50 and insulating layers 48 and 52. Source silicide region 56 and drain silicide region 58 are formed on the opposite sides of select gate 22 and memory gate 24. Source region 53 and drain region 59 are underlying silicide regions 56 and 58, respectively. Charge storage layer 50 may include a vertical leg and a horizontal leg, wherein memory gate 24 is disposed on the horizontal leg of charge storage layer 50. Sidewall spacers 54 are disposed on the sidewalls of select gate 22 and memory gate 24. Dielectric layer 60 is overlying memory gate 24. HV MOS device 202 includes gate dielectric 204 and gate electrode 206, and source and drain regions (not illustrated) on the opposite sides of gate electrode 206. NMOS device 302 includes gate dielectric 304 and gate electrode 306, and source and drain regions (not illustrated) on the opposite sides of gate electrode 306. PMOS device 402 includes gate dielectric 404 and gate electrode 406, and source and drain regions 408 on the opposite sides of gate electrode 406. In accordance with some embodiments, select gates 22, memory gates 24, and gate electrodes 206, 306, and 406 are formed of polysilicon. FIG. 2A also illustrates Contact Etch Stop Layer (CESL) 55 and Inter-Layer Dielectric (ILD) 57. In some embodiments, the top surfaces/edges of dielectric layer 60, gate spacers 54, select gates 22, CELS 55, and ILD 57 are level with each other.

FIG. 2B is a cross-sectional view obtained from the plane containing line B-B in FIG. 1, and FIG. 2C is a cross-sectional view obtained from the plane containing line C-C in FIG. 1. Unless specified otherwise, throughout the description, all cross-sectional views in the figures with figure numbers ended with letter "A" are obtained from the same plane that contains line A-A in FIG. 1, all cross-sectional views in the Figures with figure numbers ended with letter "B" are obtained from the same plane that contains line B-B in FIG. 1, and all cross-sectional views in the Figures with figure numbers ended with letter "C" are obtained from the same plane that contains line C-C in FIG. 1.

Referring to FIG. 2B, which shows a view of contact region 34A, memory gate electrode 24 is illustrated. The memory gate electrode 24 in FIG. 2B is connected to the memory gates 24 in memory cells 30 as shown in FIG. 2A. FIG. 2C shows a view of contact pad region 34B, wherein select gate electrodes 22 are illustrated. The select gate electrodes 22 in FIG. 2C are connected to the select gates 22 in memory region 20 shown in FIG. 2A.

Figure 3:
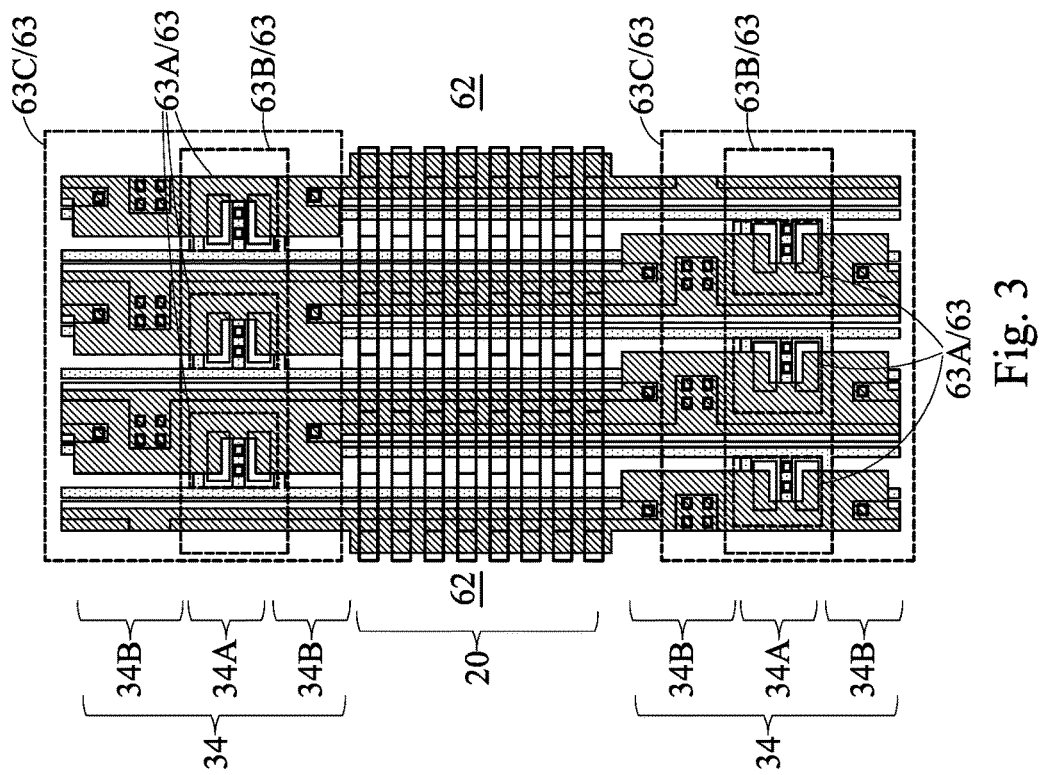

Referring to FIG. 3, photo resist 62 is formed to cover memory array 20 and portions of contact pad regions 34. Photo resist 62 is patterned to form openings 63. FIG. 3 illustrates three possible configurations of openings 63 in accordance with different embodiments. For example, openings 63A are discrete openings, with each formed for one of memory gates 24, and are formed in contact pad regions 34A. Opening 63B is a strip opening in contact pad regions 34A and extending through a plurality of memory gates 24 and select gates 22. Openings 63C are wide openings extending into both contact pad regions 34A and 34B.

Figure 4A:
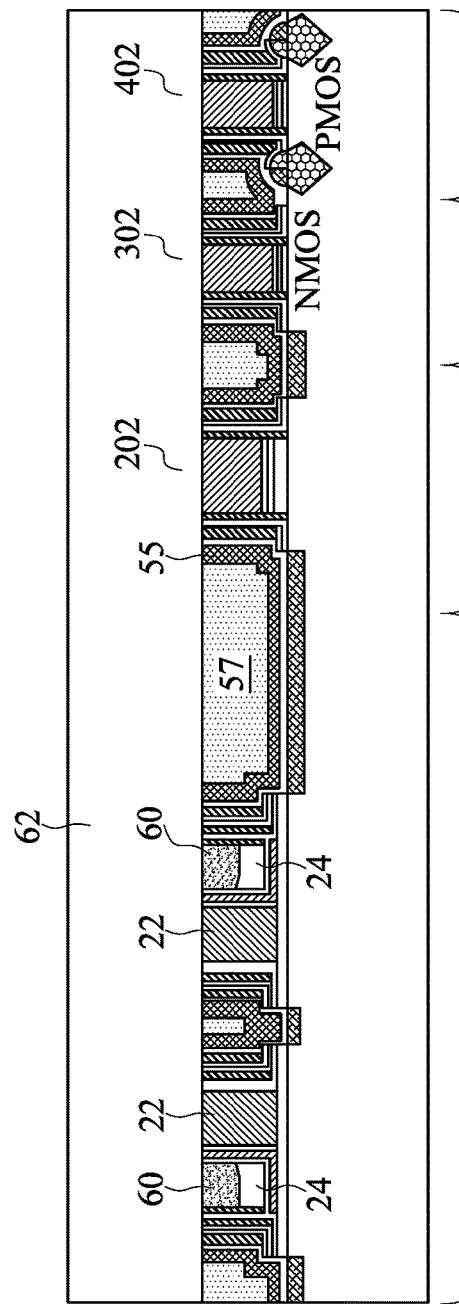
Figure 4C:
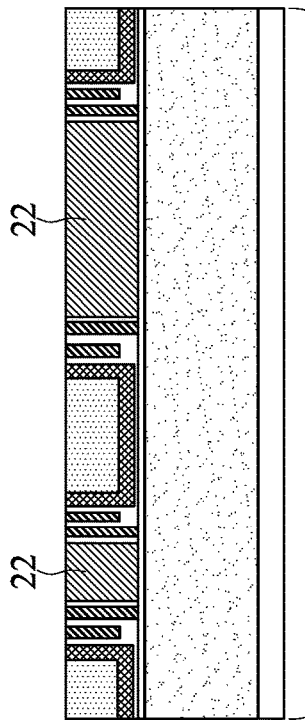
Figure 4B:
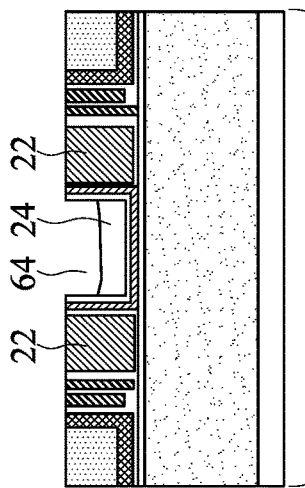

FIGS. 4A, 4B, and 4C illustrate the cross-sectional views of the structure shown in FIG. 3. As shown in FIG. 4A, photo resist 62 covers the memory device region 100 and device regions 200, 300, and 400. Referring to FIG. 4B, photo resist 62 (FIG. 4A) is used as an etching mask to etch dielectric layer 60 (FIG. 2A), which covers memory gate 24, so that recess 64 is formed over memory gate 24. The other features shown in FIGS. 4B and 4C are either resistant to the etchant, or have a low etching rate due to their small exposure areas to the etchant. Accordingly, the other features in FIGS. 4B and 4C are left in the resulting structure. Photo resist 62 is then removed.

FIGS. 5A, 5B, and 5C illustrate the formation of conductive hard mask layer 66 and the respective patterning. First, a blanket conductive hard mask layer 66 is formed. Hard mask layer 66 may be formed of titanium, tantalum, titanium nitride, tantalum nitride, or the like. Hard mask layer 66 extends into recess 64 (FIG. 5B), and are formed on the top surface of memory gate 24 and on the sidewalls of recess 64. Next, photo resist 65 is formed to cover some areas, including regions 100, 200, 300, and 400 in FIG. 5A and contact pad region 34A. Contact pad region 34B is exposed through photo resist 65, and the exposed portions of hard mask layer 66 are etched. The resulting structure is shown in FIGS. 5A, 5B, and 5C.

Figure 6:
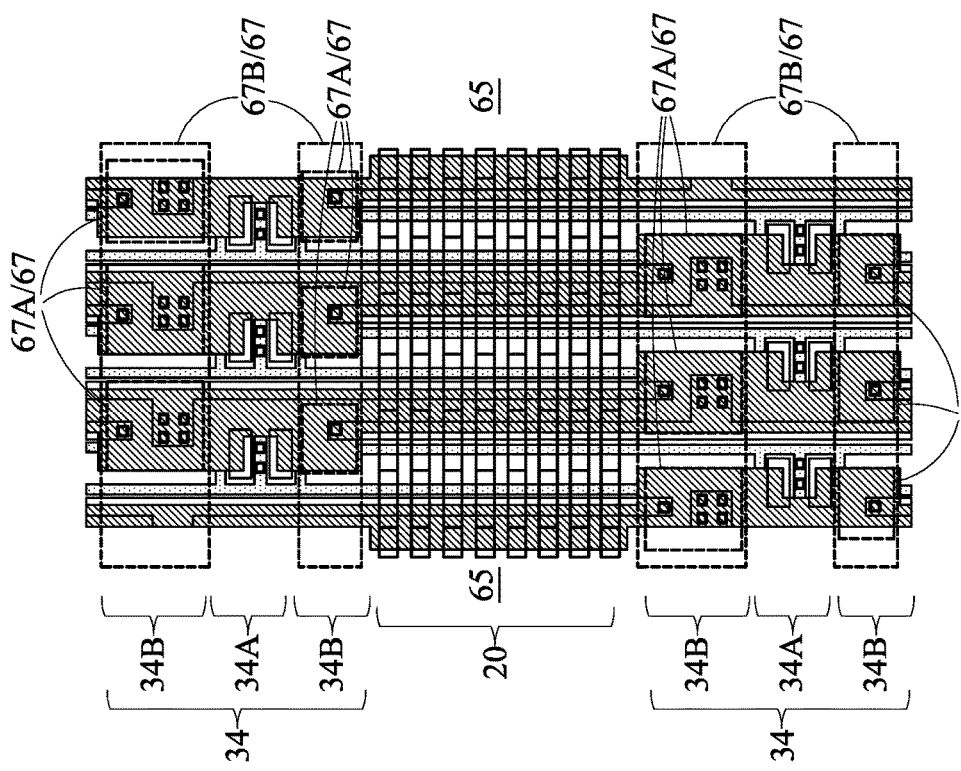

FIG. 6 illustrates a top view of the structures in FIGS. 5A, 5B, and 5C. Openings 67 are formed in photo resist 65. Rectangles 67A and 67B are the likely shapes and positions of openings 67 in accordance with different embodiments, wherein the portions of hard mask layer 66 (FIGS. 5A and 5B) are removed from openings 67A or 67B.

Figure 7:
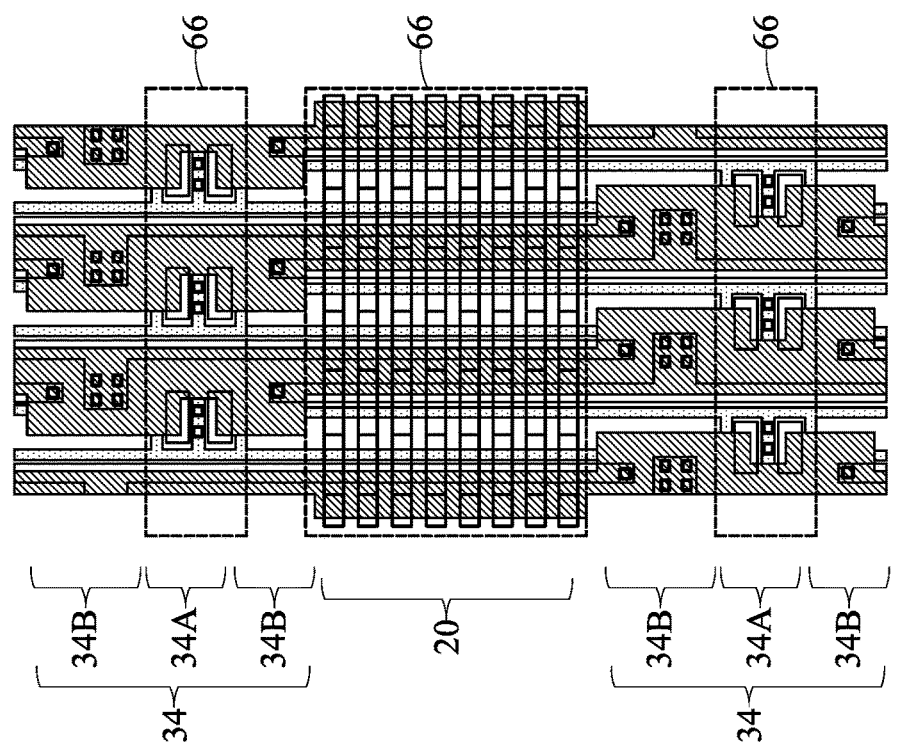

FIG. 7 illustrates the remaining portions of hard mask layer 66. The hard mask layer 66 shown in FIG. 7 corresponds to the embodiments in which the openings in photo resist 65 have the shape of 67B in FIG. 6. As shown in FIG. 7, hard mask layer 66 remains to cover memory array 20 and contact pad regions 34A.

Figure 8A:
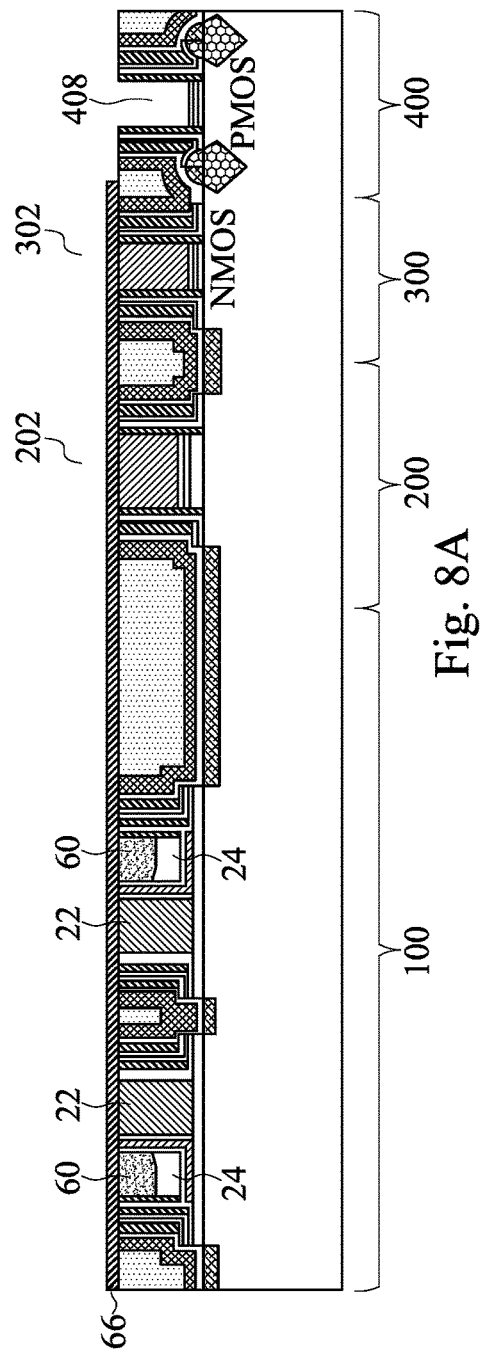
Figure 8B:
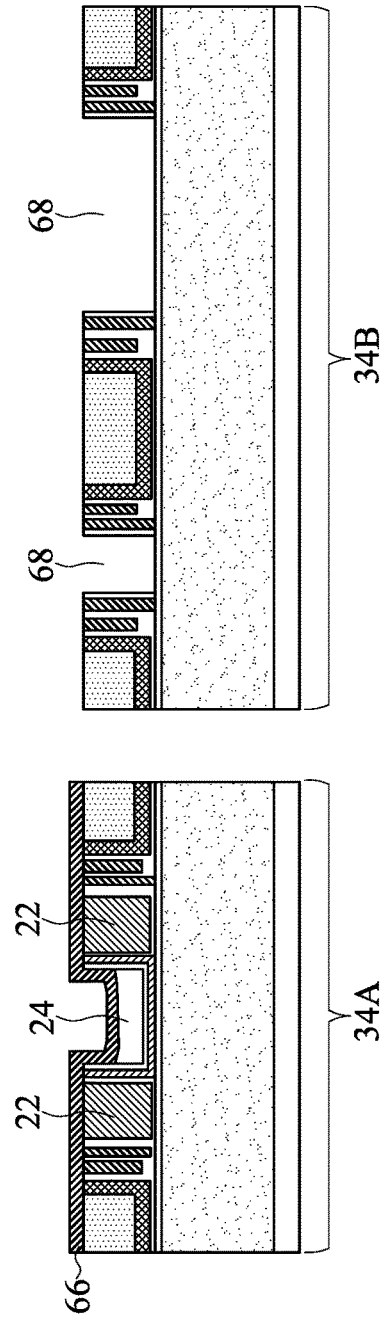
Figure 8C:
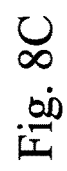

Next, as shown in FIGS. 8A, 8B, and 8C, the remaining photo resist 65 (FIGS. 5A and 5B) is removed. Gate electrode 406 (FIG. 5A) and portions of select gates 22 that are not covered by hard mask layer 66 are also etched. In accordance with some embodiments, the etching includes two steps, which includes a dry etching performed before the removal of photo resist 65, and a wet etching performed after the removal of photo resist 65. In alternative embodiments, the etching is performed after the removal of photo resist 65. Recesses 68 and 408 are formed due to the removal of select gates 22 and gate electrode 406, respectively.

Figure 9A:
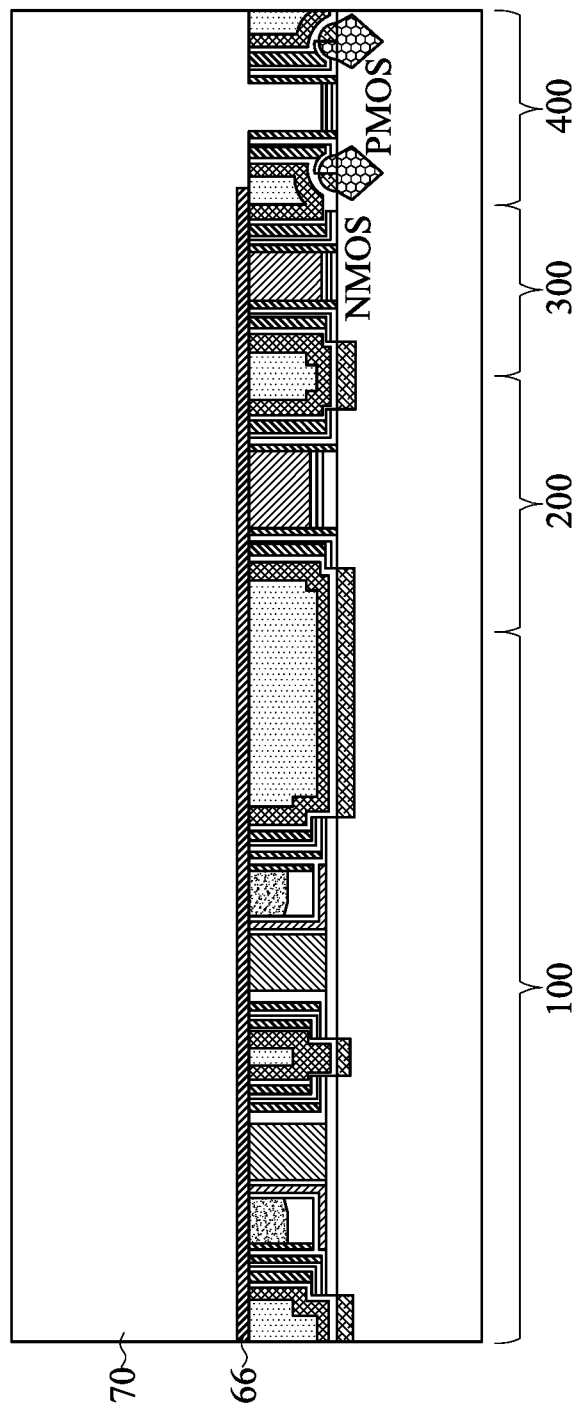

A conductive material is then formed to fill recesses 68 and 408, and the resulting structure is shown in FIGS. 9A, 9B, and 9C. Conductive material 70 may comprise a metal-containing material such as a metal carbonitride (such as TaCN). In the illustrated embodiments in which conductive material 70 also forms the gate of PMOS device 403, conductive material 70 may have a work function close to the valence band of silicon, wherein the work function may be in the range between about 4.5 eV and about 4.9 eV. Conductive material 70 may have a homogeneous structure including a single layer, or may have a composite structure including a plurality of layers. The formation method may also include Atomic Layer Deposition (ALD).

A planarization step, which is performed to remove excess portions of conductive material 70 and hard mask layer 66, is then performed, and the resulting structure is shown in FIGS. 10A, 10B, and 10C. The planarization may be performed using Chemical Mechanical Polish (CMP), which stops on the top surface of ILD 57. Accordingly, the features shown in FIGS. 10A, 10B, and 10C including 22, 57, 60, 72, 73, and 410 have top surfaces level with each other. After the CMP, the remaining portions of conductive material 70 form new select gate electrodes 72 (FIG. 10C), which are connected to select gates 22 of memory cells 30 (FIG. 10A). The remaining portion of conductive material in device region 400 forms replacement gate 410. Furthermore, as shown in FIG. 10B, in contact pad region 34A, the portions of hard mask layer 66 over the top surface of ILD 57 are also removed. As a result, some remaining portions 73 of conductive material 70 are over the remaining portions of hard mask layer 66. As shown in FIG. 10B, the original memory gate electrodes 24 and the overlying remaining portions of hard mask layer 66 and metal-containing portions 73 in combination form new memory-gate electrodes. In memory region 100 (FIG. 10A), however, memory gates 24 remain to be covered by dielectric layers 60.

Figure 11A:
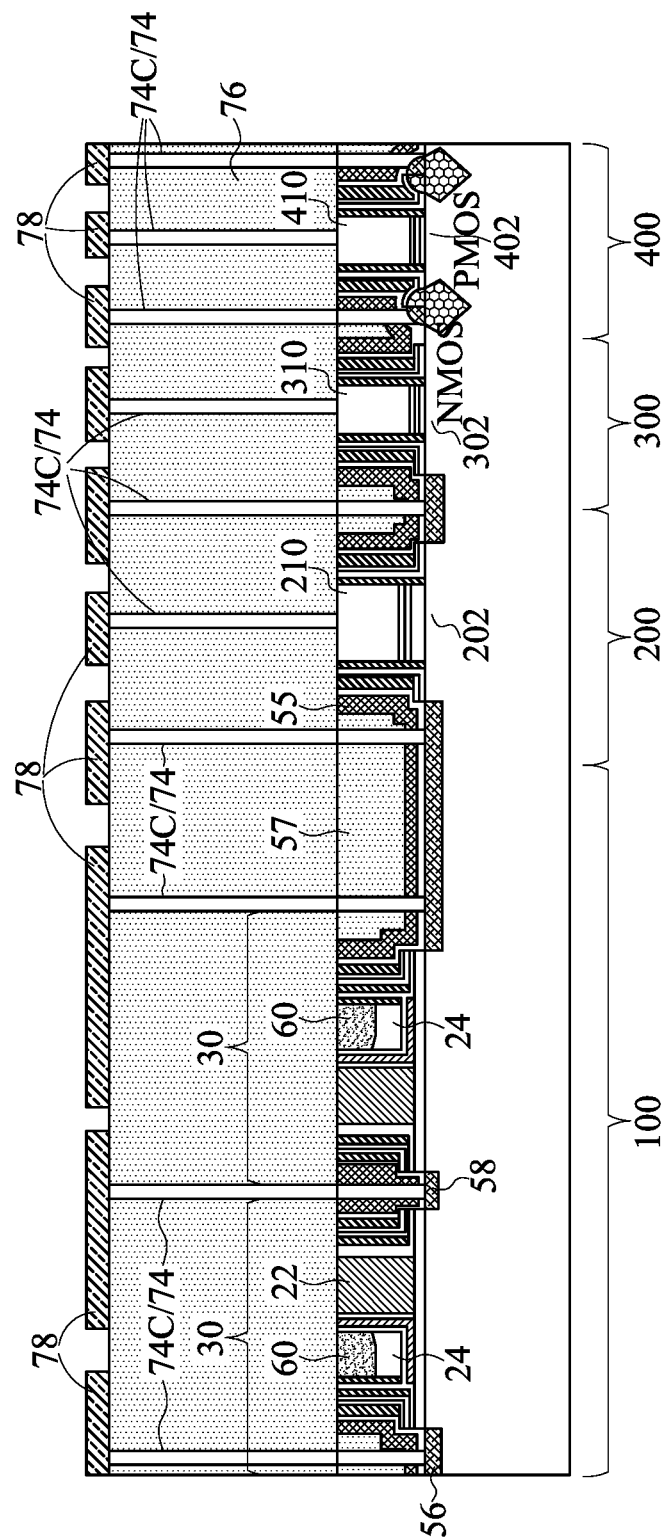

FIGS. 11A, 11B, and 11C illustrate the remaining process steps for forming contact plugs 74 (including 74A, 74B, and 74C). In accordance with some embodiments, gate electrodes 206 and 306 (FIG. 10A) are replaced with replacement gates 210 and 310, respectively, as shown in FIG. 11A. Replacement gate 310 may be formed of a metal having a low work function between about 4.3 eV and about 4.5 eV, for example. The formation process may also include forming ILD 76 over the structure in FIGS. 10A, 10B, and 10C, forming contact openings in ILD 76, and forming contact plugs 74 in the contact openings. Metal lines 78, which may be in the bottom metal layer (M1) may then be formed to electrically connect to contact plugs 74. As shown in FIG. 11A, contact plugs 74 include source and drain contact plugs 74C, which are electrically connected to the source and drain silicide regions of devices 30, 202, 302, and 402. Contact plugs 74C penetrate through ILD 57 and CESL 55. In addition, the gate electrode of HV MOS device 202 and the gate electrode of NMOS device 302 are replaced by metal-containing gate electrodes 210 and 310, respectively. The details for forming the replacement gates are not discussed in detail herein.

Referring to FIG. 11B, contact plugs 74 also include contact plug 74A, which is over and in contact with conductive material 73, and hence is electrically connected to the underneath memory gate 24 through conductive hard mask layer 66. Referring to FIG. 11C, contact plugs 74 include contact plugs 74B, which are over and in contact with select gates 72. Accordingly, in accordance with some embodiments, contact plugs 74A and 74B are in contact with metal-containing materials 73 and 72, respectively, and hence the respective contact resistance values are low.

Figure 12:
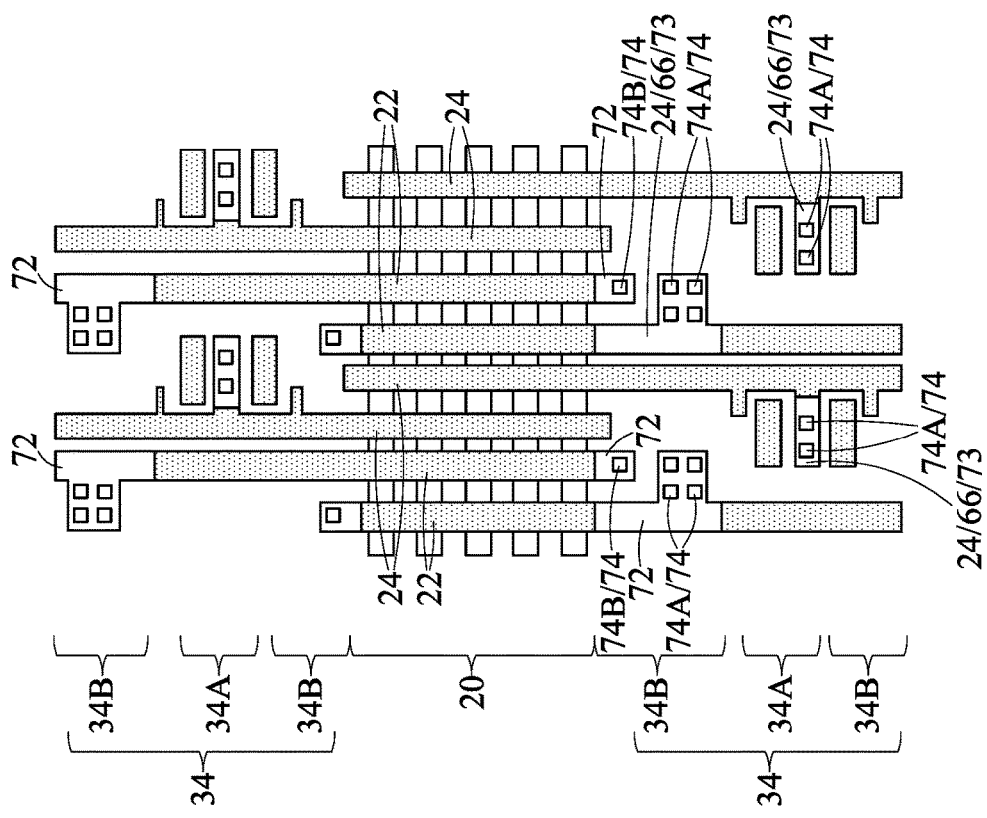

FIG. 12 illustrates a top view of a final structure formed in accordance with alternative embodiments, wherein select gates 22 and select gate electrodes 72, memory gates 24 and memory gate electrodes 24/66/73 are marked to illustrate their positions. It is appreciated that due to different combinations of the size and the positions of openings 63 (FIG. 3) and openings 67 (FIG. 6), and also due to the symmetrical/non-symmetrical layouts of memory array 20, select gates 22, and memory gates 24, there are many combinations of sizes and positions in the design of select gates 72 and 24/66/73, and these combinations are in the scope of the present disclosure.

FIGS. 13A through 17C illustrate cross-sectional views of intermediate stages in the formation of electrical connections in accordance with alternative embodiments. These embodiments are similar to the embodiments in FIGS. 1 through 12, except that the dielectric layers 60 overlapping memory gates 24 (FIG. 17B) are not replaced with metal-containing materials. Unless specified otherwise, the materials and formation methods of the components in these embodiments are essentially the same as the like components, which are denoted by like reference numerals in the embodiments shown in FIGS. 1 through 12. The details regarding the formation process and the materials of the components shown in FIGS. 13A through 17C may thus be found in the discussion of the embodiment shown in FIGS. 1 through 12.

The initial structure of these embodiments is essentially the same as shown in FIGS. 2A, 2B, and 2C. In these embodiments, the steps shown in FIGS. 3, 4A, 4B, and 4C are skipped. Next, hard mask layer 66 is formed, as shown in FIGS. 13A, 13B, and 13C. Hard mask layer 66 is formed as a blanket layer in accordance with some embodiments, followed by forming photo resist 65 to pattern hard mask layer 66. As shown in FIGS. 13A and 13B, photo resist 65 covers portions of hard mask layer 66 in regions 100, 200, 300, and 400 and contact pad region 34A. Photo resist 65 is removed from contact pad region 34B to form opening 67, as shown in FIG. 13C. The possible locations and sizes of openings 67 may be essentially the same as shown in FIG. 6, which illustrates 67A and 67B as alternative embodiments. As shown in FIG. 13B, in metal pad region 34A, the remaining hard mask layer 66 is over, and may be in physical contact with, dielectric layer 60.

Figure 15A:
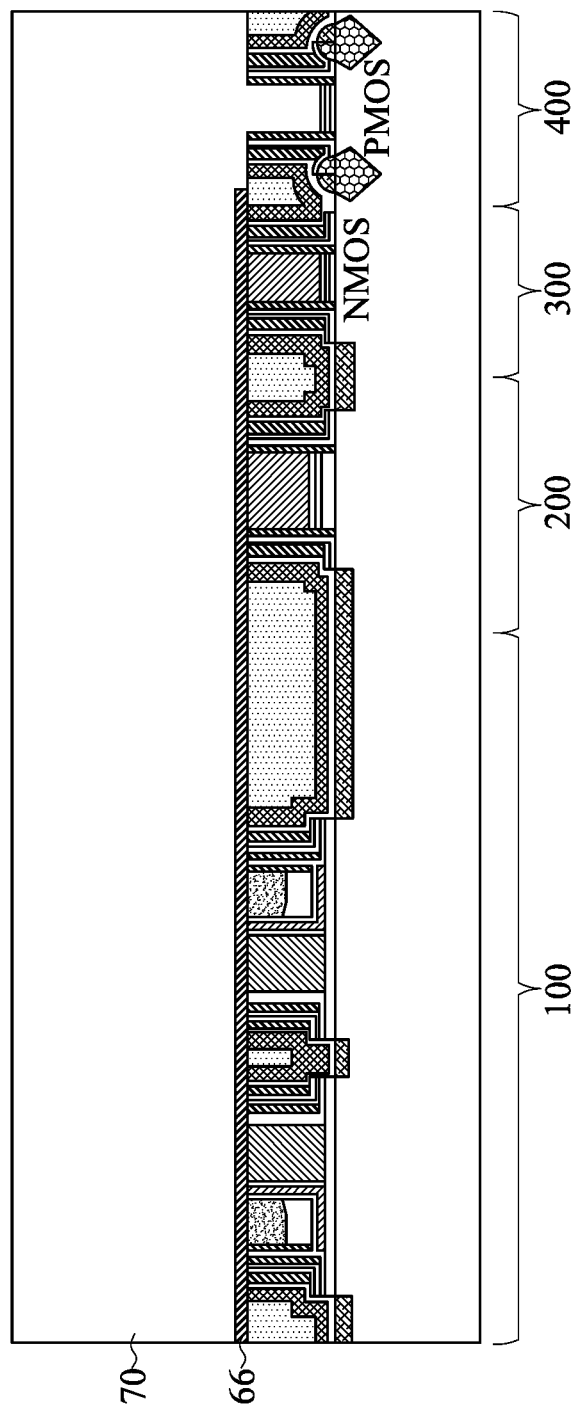
Figure 15B:
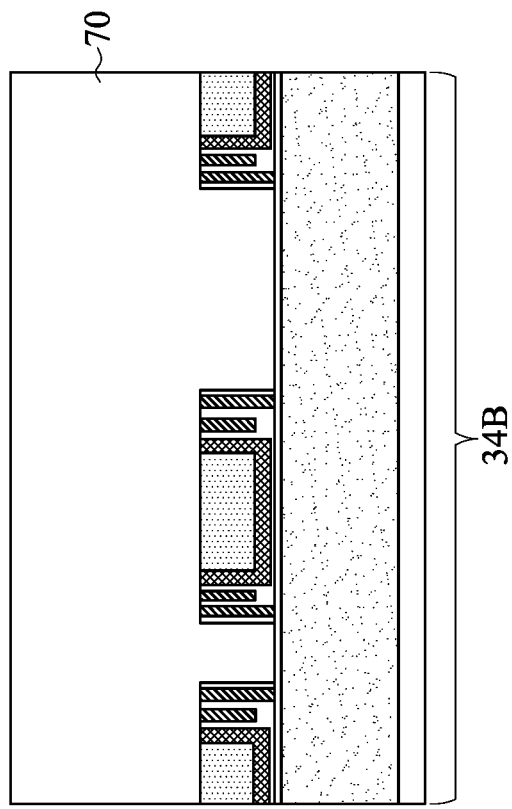
Figure 15C:
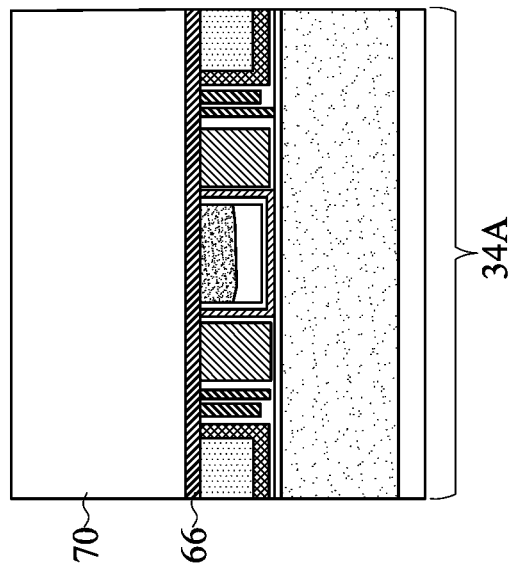

Hard mask layer 66 is then used as an etching mask to remove exposed gate electrode 406 (FIG. 13A) and select gates 22 (FIG. 13C), and photo resist 65 is also removed. The resulting structure is shown in FIGS. 14A, 14B, and 14C. Recesses 68 and 408 are thus formed in contact pad region 34B and device region 400, respectively. As shown in FIG. 14B, in contact pad region 34A, dielectric layer 60 remains to be over memory gate 24. FIGS. 15A, 15B, and 15C illustrate the formation of metal-containing conductive material 70. FIGS. 16A, 16B, and 16C illustrate the planarization for removing excess portions of metal-containing conductive material 70. The details of the formation process are similar to what is shown in FIGS. 9A through 10C, and hence are not repeated herein.

Figure 17A:
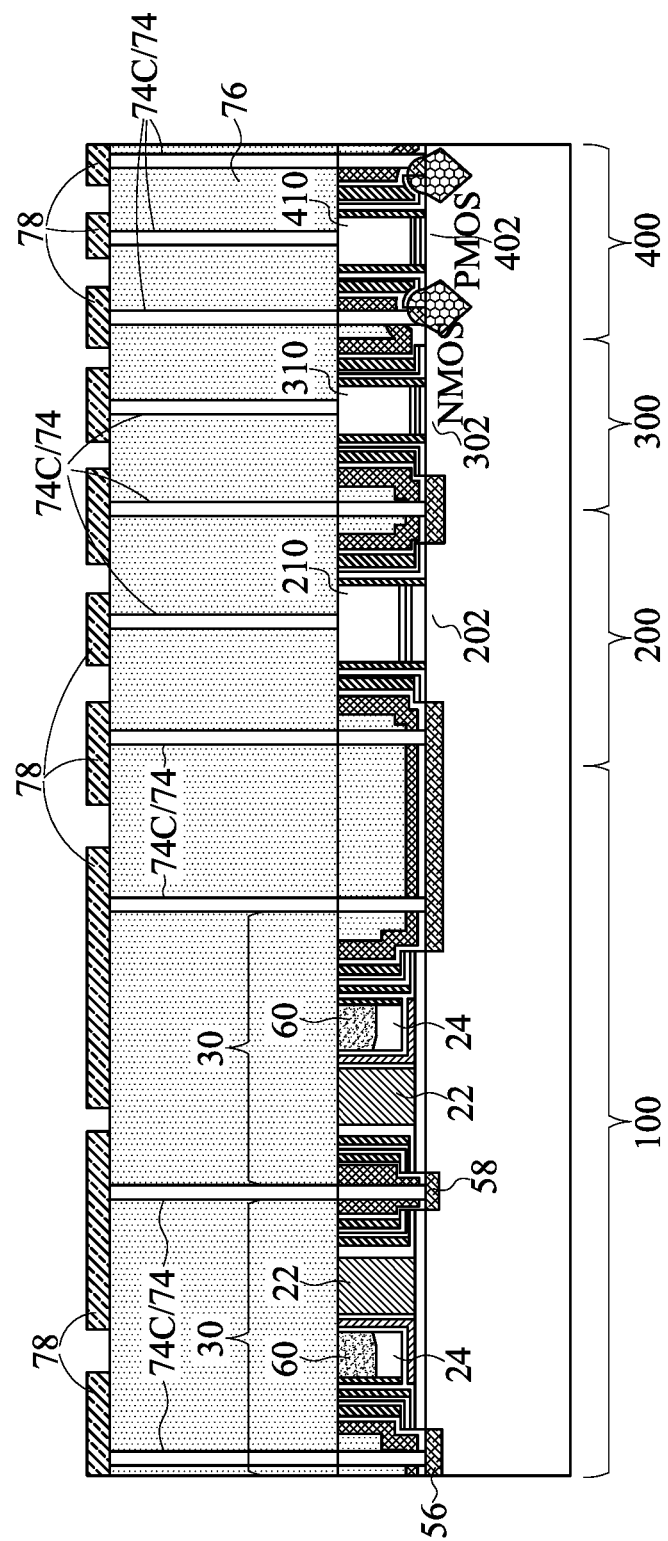
Figure 17C:
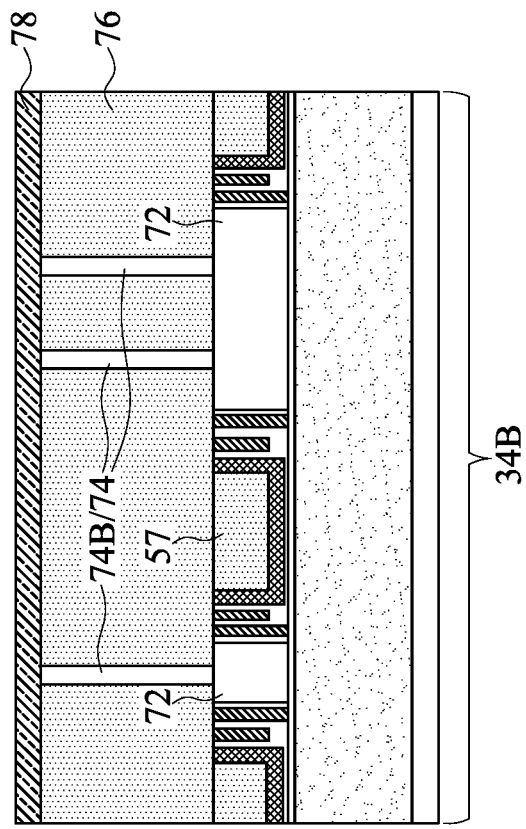
Figure 17B:
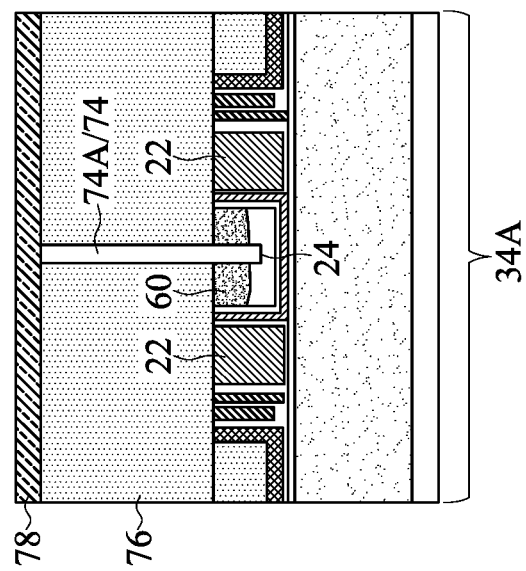

FIGS. 17A, 17B, and 17C illustrate the formation of replacement gates 210 and 310, ILD 76, contact plugs 74, and metal lines 78. As shown in FIG. 17A, contact plugs 74 include source and drain contact plugs 74C, which are electrically connected to source and drain silicide regions of devices 30, 202, 302, and 402. Contact plugs 74C penetrate through ILD 57 and CESL 55. Referring to FIG. 17B, contact plugs 74 also include contact plug 74A, which penetrates through dielectric layer 60 to electrically connect to memory gate 24. Although contact plugs 74A may be in contact with the silicon of memory gate 24, and hence the contact resistance is high, the method in accordance with these embodiments may save a lithography mask and a lithography step (which is shown in FIG. 3). Referring to FIG. 17C, contact plugs 74 include contact plugs 74B, which are over and in contact with select gates 72. Accordingly, in accordance with some embodiments, contact plugs 74B are in contact with metal-containing material portion 72, and hence the contact resistance is low.

In the above-disclosed embodiments, select gates 72 (FIGS. 11A, 11B, 11C, 17A, 17B, and 17C) and memory gate portions 73 are formed by the same process that is used for replacing the original polysilicon for PMOS device 402 with replacement gates. In alternative embodiments, gate electrode 306 (FIGS. 2A and 13A) of the NMOS device 302 may be replaced by metal-containing gates, and select gates 72 and memory gate portions 73 may be formed simultaneously when the original polysilicon of gate electrode 306 is replaced.

In the embodiments of the present disclosure, by replacing the polysilicon of the select gates and memory gates in the split gate flash memory devices with metal-containing gates, the respective contact resistance is reduced. Furthermore, the replacement of the select gates and memory gates may be performed simultaneously as the replacement of IO devices, logic devices, and/or SRAM devices. Therefore, the manufacturing cost is not increased.

In accordance with some embodiments, an integrated circuit structure includes a plurality of flash memory cells forming a memory array, wherein each of the plurality of flash memory cells includes a select gate and a memory gate. A select gate electrode includes a first portion including polysilicon, wherein the first portion forms select gates of a column of the memory array, and a second portion electrically connected to the first portion, wherein the second portion includes a metal. A memory gate electrode has a portion forming memory gates of the column of the memory array.

In accordance with other embodiments, an integrated circuit structure includes a plurality of flash memory cells forming a memory array. Each of the plurality of flash memory cells includes a select gate and a memory gate. A select gate electrode includes a first portion including polysilicon, wherein the first portion forms select gates of a column of the memory array. The select gate electrode further includes a second portion electrically connected to the first portion, wherein the second portion comprises a metal. A memory gate electrode includes a first portion forming memory gates of the column of the memory array, and a second portion, which includes a polysilicon bottom portion and a metal-containing top portion. The metal-containing top portion and the second portion of the select gate electrode are formed of a same material with same elements and same percentages of the elements, and have top surfaces level with each other.

In accordance with yet other embodiments, a method includes removing a first portion of a select gate electrode of a flash memory array. The select gate electrode further includes a second portion electrically connected to the first portion, wherein the second portion remains after the first portion is removed. The second portion forms select gates of a column of memory cells of the flash memory array. The method further includes filling a metal-containing material in a first recess left by the first portion of the select gate electrode.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    providing a flash memory array comprising a column of memory cells and a select gate electrode on a substrate, the select gate electrode comprising a first portion and a second portion electrically connected to the first portion, the second portion of the select gate electrode coupled to select gates of the column of memory cells;
    replacing the first portion of the select gate electrode with a metal-containing material, the second portion remaining after the first portion is replaced;
    simultaneously removing a gate electrode of a Metal-Oxide-Semiconductor (MOS) device on the substrate to form a first recess while replacing the first portion of the select gate electrode, the MOS device being a device selected from a group consisting essentially of an input/output device, a logic device, and a Static Random Access Memory (SRAM) device; and
    simultaneously forming the metal-containing material in the first recess while replacing the first portion of the select gate electrode.

2. The method of claim 1, further comprising:
    removing a first portion of a dielectric layer overlapping a first portion of a memory gate electrode of the flash memory array to form a second recess, the memory gate electrode further comprising a second portion of the memory gate electrode electrically connected to the first portion of the memory gate electrode, the second portion of the memory gate electrode coupled to memory gates of the column of memory cells;
    filling a conductive hard mask layer in the second recess; and
    simultaneously forming the metal-containing material in the second recess and over the conductive hard mask layer while replacing the first portion of the select gate electrode.

3. The method of claim 2, wherein the removing the first portion of the select gate electrode comprises etching polysilicon using an extension portion of the conductive hard mask layer as an etching mask.

4. The method of claim 2, wherein the dielectric layer further comprises a second portion of the dielectric layer overlapping the second portion of the memory gate electrode, and wherein the second portion of the dielectric layer remains after the first portion of the dielectric layer is removed.

5. The method of claim 1 further comprising:
    forming an Inter-Layer Dielectric (ILD) over the select gate electrode; and
    forming a contact plug extending through the ILD, wherein the contact plug comprises a bottom surface in contact with a top surface of the metal-containing material.

6. A method comprising:
    providing a memory device comprising a memory array, a select gate electrode, a memory gate electrode, and a dielectric layer over the memory gate electrode, the select gate electrode having a first segment extending into the memory array and a second segment outside of the memory array, the memory gate electrode having a first segment extending into the memory array and a second segment outside of the memory array;
    removing portions of the dielectric layer overlying the second segment of the memory gate electrode to form first openings;
    removing all of the second segment of the select gate electrode to form second openings, the first segment of the select gate electrode remaining after removing the second segment of the select gate electrode; and
    forming a metal-containing material in the first openings and the second openings.

7. The method of claim 6, further comprising:
    forming an ILD over the memory device, the select gate electrode, and the memory gate electrode; and
    forming conductive plugs in the ILD contacting the second segment of the select gate electrode and the second segment of the memory gate electrode.

8. The method of claim 7, wherein a first one of the conductive plugs contacts the metal-containing material in the first openings.

9. The method of claim 7, where a first one of the conductive plugs contacts the second segment of the memory gate electrode.

10. The method of claim 6, wherein removing the portions of the dielectric layer overlying the second segment of the memory gate electrode comprises:
    forming a photoresist over the memory device;
    patterning openings in the photoresist over the second segment of the select gate electrode and the second segment of the memory gate electrode; and
    removing the portions of the dielectric layer overlying the second segment of the memory gate electrode with an etching selective to a material of the dielectric layer.

11. The method of claim 6, further comprising:
    before removing the second segment of the select gate electrode, forming a hard mask over the memory array, the first segment of the select gate electrode, and the first segment and the second segment of the memory gate electrode; and
    after forming the hard mask, etching the second segment of the select gate electrode using the hard mask as an etching mask to form the second openings.

12. The method of claim 11, wherein forming the metal-containing material in the first openings comprises depositing the metal-containing material over the hard mask and the first segment of the memory gate electrode.

13. The method of claim 6, wherein the first segment and the second segment of the select gate electrode comprise polysilicon.

14. The method of claim 6, further comprising planarizing the select gate electrode and the memory gate electrode, the select gate electrode and the memory gate electrode having top surfaces level with each other after the planarizing.

15. The method of claim 6, wherein the second openings are deeper than the first openings.

16. The method of claim 6, wherein prior to removing the portions of the dielectric layer overlying the second segment of the memory gate electrode, the first segment and second segment of the select gate electrode are polysilicon, and wherein after forming the metal-containing material, the first segment of the select gate electrode is polysilicon and the second segment of the select gate electrode is the metal-containing material.

17. A method comprising:
    providing a plurality of flash memory cells on a substrate, each of the plurality of flash memory cells comprising a Metal-Oxide-Semiconductor (MOS) device, a select gate, and a memory gate;
    forming a select gate electrode for the select gates over the substrate, the select gate electrode comprising a first portion of a first conductive material coupled to the select gates, and a second portion of the first conductive material;
    simultaneously replacing a gate electrode of the MOS device and the second portion of the select gate electrode with a second conductive material different from the first conductive material, wherein after the second portion of the select gate electrode is replaced, the first portion and the second portion of the select gate electrode are continuously connected to form a straight conductive strip in a plan view; and
    planarizing the select gate electrode and the gate electrode of the MOS device, the first portion and the second portion of the select gate electrode being the same height after the planarizing.

18. The method of claim 17, wherein the first conductive material is polysilicon and the second conductive material is a metal.

19. The method of claim 17, further comprising forming a memory gate electrode for the memory gate.

20. The method of claim 19, further comprising:
    forming an ILD over the plurality of flash memory cells, the select gate electrode, and the memory gate electrode; and
    forming conductive plugs in the ILD contacting the select gate electrode and the memory gate electrode.

* * * * *